United States Patent
Boardman et al.

[11] Patent Number: 5,328,865
[45] Date of Patent: Jul. 12, 1994

[54] METHOD FOR MAKING CUSP-FREE ANTI-FUSE STRUCTURES

[75] Inventors: William J. Boardman, San Jose; David P. Chan, San Ramon; Kuang-Yeh Chang, Los Gatos; Calvin T. Gabriel, Pacifica; Vivek Jain, Milpitas; Subhash R. Nariani, San Jose, all of Calif.

[73] Assignee: VLSI Technology, Inc., San Jose, Calif.

[21] Appl. No.: 11,084

[22] Filed: Jan. 29, 1993

Related U.S. Application Data

[63] Continuation of Ser. No. 755,259, Sep. 4, 1991, abandoned.

[51] Int. Cl.5 .................. H01L 21/70; H01L 27/00
[52] U.S. Cl. .................. 437/60; 437/228; 437/192; 437/922
[58] Field of Search .......... 437/922, 48, 52, 228, 437/192, 60; 257/529, 530

[56] References Cited

U.S. PATENT DOCUMENTS

| | | | |
|---|---|---|---|
| 4,419,812 | 12/1983 | Topich | 437/919 |
| 4,569,121 | 2/1986 | Lim et al. | 437/52 |
| 4,748,490 | 5/1988 | Hoollingsworth | 357/34 |
| 4,826,785 | 5/1989 | McClure et al. | 437/192 |
| 4,853,347 | 8/1989 | Bukhman et al. | 437/192 |
| 4,862,243 | 8/1989 | Welch et al. | 357/51 |
| 4,876,220 | 10/1989 | Mohsen et al. | 437/193 |
| 4,914,055 | 4/1990 | Gordon et al. | 357/51 |
| 5,070,384 | 12/1991 | McCollum et al. | 437/193 |
| 5,087,957 | 2/1992 | Chen et al. | 357/51 |
| 5,210,598 | 5/1993 | Nakazaki et al. | 257/530 |

FOREIGN PATENT DOCUMENTS

| | | | |
|---|---|---|---|
| 0118158 | 3/1984 | European Pat. Off. | |
| 1-124240 | 5/1989 | Japan | 437/192 |
| 2-23654 | 1/1990 | Japan | |
| 8503599 | 3/1984 | PCT Int'l Appl. | |

Primary Examiner—Olik Chaudhuri
Assistant Examiner—H. Jey Tsai
Attorney, Agent, or Firm—Hickman & Beyer

[57] ABSTRACT

A method for making an anti-fuse structure characterized by the steps of forming a conductive base layer; forming an anti-fuse layer over the base layer; patterning the anti-fuse layer to form an anti-fuse island; forming an insulating layer over the anti-fuse island; forming a via hole through the insulating layer to the anti-fuse island; forming a conductive connection layer over the insulating layer and within the via hole; and patterning the conductive connection layer to form a conductive contact to the anti-fuse island. Preferably, the anti-fuse island comprises amorphous silicon which can optionally be covered with a thin layer of a titanium-tungsten alloy.

11 Claims, 4 Drawing Sheets

METHOD FOR MAKING CUSP-FREE ANTI-FUSE STRUCTURES

This is a continuation of copending application(s) Ser. No. 07/755,259 filed on Sep. 4, 1991, now abandoned.

BACKGROUND OF THE INVENTION

This invention relates generally to integrated circuits and more particularly to anti-fuse structures for field programmable gate arrays, programmable read-only memories (PROMS) and the like.

Field programmable gate arrays include a large number of logic elements, such as AND gates and OR gates, which can be selectively coupled together by means of fuses or anti-fuses to perform user designed functions. An unprogrammed fuse-type gate array is programmed by selectively blowing fuses within the device, while an unprogrammed anti-fuse type gate array is programmed by causing selected anti-fuses to become conductive.

There are many types of PROMS including standard, write-once PROMS, erasable programmable read-only memories (EPROMS), electrically erasable programmable read-only memories (EEPROMS) etc. A PROM usually comprises an array of memory cells arranged in rows and columns which can be programmed to store user data. PROMS are typically fuse-type devices.

Fuses for field programmable gate arrays, PROMS and the like are often made from a titanium-tungsten (TiW) alloy and are usually shaped somewhat like a bow-tie having a narrow, central neck and wide ends. The neck of the fuse is typically about 2 microns wide, while the ends of the fuse are typically about 6 microns wide. When a sufficiently high voltage (usually on the order of 10 volts d.c.) is applied to the fuse, the current flowing through the fuse will cause it to heat-up and will eventually melt the fuse at its neck, thereby "blowing" the fuse.

Anti-fuses include a material which initially has a high resistance but which can be converted into a low resistance material by the application of a programming voltage. For example, amorphous silicon, which has an intrinsic resistivity of approximately 1 mega-ohm-centimeter, can be fashioned into 1 micron wide link vias having a resistance of approximately 1-2 giga-ohms. These link vias can then be melted and recrystallized by the application of a programming voltage in the range of 10-12 volts d.c. to form link vias having a resistance less than 100 ohms. These low resistance vias can couple together logic elements of a field programmable gate array so that the gate array will perform user-desired functions, or can serve as memory cells of a PROM.

Fuses in electronic devices are much more prevalent today than anti-fuses because they are easier to manufacture and have a better record of reliability. This is due, in part, to the way that that anti-fuses have been made. Typically, anti-fuses are formed within holes in an insulating layer by some form of deposition process. Deposition processes tend to be somewhat anisotropic, resulting in uneven deposition of the anti-fuse material within the holes due to a shadowing of the bases of the holes by the holes' sidewalls. This shadowing effect creates imperfections in the anti-fuse material, such as creases in the material known as "cusps". These cusps are weak points in the anti-fuse material and can result in the failure of the anti-fuse structure. Moreover, cusping is a strong function of the size of the hole, resulting in non-linear sealability of the process. Unfortunately, even one bad anti-fuse structure in an integrated circuit device may render the entire device defective.

Another problem encountered in making anti-fuses is that the most common anti-fuse material, amorphous silicon, is relatively delicate. For example, it has been found that if aluminum is permitted to contact amorphous silicon that aluminum atoms will diffuse into the silicon, thereby lowering the resistance of the silicon to the point where an anti-fuse structure might appear to have been programmed even if it had not been.

Despite the difficulty in manufacturing anti-fuse structures and their relative lack of reliability, they do have the very desirable feature of being small in size. For example, a TiW fuse with a 2 micron neck and 6 micron end widths permits approximately 4,000 fuses to be provided on a typical device. In contrast, a 1 or 1.2 micron diameter anti-fuse via permits 80,000-100,000 fuses to be provided on a single device. Therefore, arrays of anti-fuses can provide vastly greater numbers of interconnections and can store much larger amounts of information that devices using conventional fuse technology.

SUMMARY OF THE INVENTION

The method of the present invention produces anti-fuse structures which are virtually cusp-free and which are relatively immune to contamination by contact with conventional aluminum connecting lines and the like.

Briefly, the method of the invention includes the formation of a conductive base layer and the subsequent formation of an anti-fuse layer over the conductive base layer. The anti-fuse layer is patterned to create an island of anti-fuse material over which an insulating layer is formed. A via hole is etched into the insulating layer in alignment with the anti-fuse island, and a conductive material is deposited over the insulating layer and into the via hole to form an electrical contact with the anti-fuse island. As an optional step, a conductive, protective layer can be formed over the top of the anti-fuse layer prior to the formation of the anti-fuse island.

The resultant anti-fuse structure preferably includes a conductive base, an anti-fuse material having a lower surface abutting the base, a conductive protective material disposed over an upper surface of the anti-fuse material, an insulating layer disposed over the conductive protective material and the anti-fuse material, and a conductive contact extending through a via hole provided in the insulating layer to contact the conductive protective material. Preferably, the anti-fuse material includes amorphous silicon, the conductive protective material includes an alloy of titanium and tungsten, and the conductive base and conductive contact include aluminum.

Since the anti-fuse islands are formed on the substantially planar surface of the base layer rather than in holes in the insulating layer, they can be formed totally free of cusps and other defects which are the result of the shadowing effect. This results in an anti-fuse structure which has programming characteristics which are substantially independent of the anti-fuse size. It is therefore possible to scale the anti-fuse structure to any desired size, including sub-micron geometries.

Additionally, the conductive protective layer provides a good electrical contact to the amorphous silicon while protecting it from potentially damaging contact with aluminum connecting lines and vias. Also, the method of the present invention is a simpler process than the prior art method of depositing anti-fuse material in holes in an insulating layer, thereby reducing production costs and increasing yields.

These and other advantages of the present invention will become clear to those skilled in the art upon a study of the detailed description of the invention and of the several figures of the drawings.

BRIEF DESCRIPTION OF THE DRAWINGS

FIG. 1a is a detailed view of the portion of FIG. 1 encircled by broken line 1a;

FIG. 5a is a detailed view of the portion of FIG. 5 encircled by broken line 5a;

FIG. 7a is a detailed view of the portion of FIG. 7 encircled by broken line 7a;

DETAILED DESCRIPTION OF THE PREFERRED EMBODIMENTS

Figure 1:
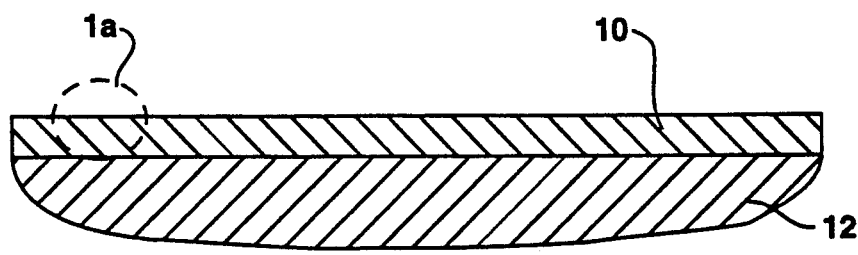
FIGS. 1-6 illustrate successive steps of the method of the present invention.

The method of the present invention will be discussed with reference to FIGS. 1-6. In FIG. 1, a conductive base layer 10 is formed over a substrate 12. The substrate 12 can be the oxidized surface of a silicon wafer, or it can be any other substantially planar surface capable of supporting the conductive base layer 10.

Figure 1A:
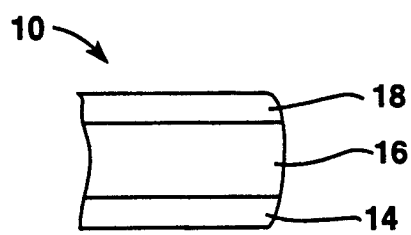

As best seen in Fig. 1a, the conductive base layer 10 is preferably a three-layer metal sandwich. A first layer 14 is preferably a 2000 angstrom thick layer of a 22:78 percent alloy of titanium-tungsten (TiW), which serves as a barrier layer. Layer 16 is preferably a 4000 angstrom thick layer of a 99:1 percent alloy of aluminum and copper, which serves as a low resistance conductor for the composite layer 10. Layer 18 is preferably an 2200 angstrom thick layer of the same TiW alloy as used in layer 14, which serves as an anti-reflective coating and which helps control diffusion of aluminum atoms from layer 16 into the amorphous silicon of the anti-fuse layer. The composite metal layer 10 is preferably deposited by a sputter deposition system, such as one of the sputter depositions systems which are commercially available from Varian, Inc. of Palo Alto, Calif., Applied Materials, Inc. of Santa Clara, Calif., and Anelva Corporation of Tokyo, Japan.

Figure 2:
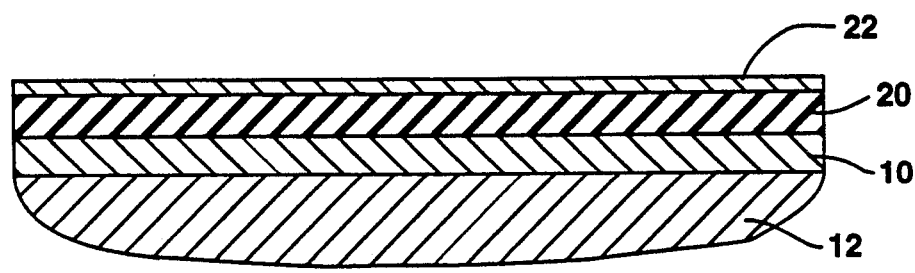

Next, as illustrated in FIG. 2, an anti-fuse layer 20 is formed over the conductive base layer 10. Preferably, the anti-fuse layer 20 comprises amorphous silicon which is deposited at relatively low temperatures within a plasma enhanced chemical vapor deposition (PECVD) system, such as the Precision 5000 CVD system from Applied Materials, Inc. or the Concept One from Novellus Corporation of San Jose, Calif. The anti-fuse layer 20 is preferably deposited to a thickness of about 1600 angstroms.

Optionally, a conductive protective layer 22 of the same TiW alloy described previously is deposited over the anti-fuse layer 20 to a thickness of approximately 800 angstroms to protect the relatively fragile anti-fuse layer 20 from subsequent etching steps and to provide a shield against the penetration of aluminum atoms and/or silicon diffusion into aluminum from subsequent thermal cycles during metallization steps. However, the conductive protective layer 22 can be omitted if subsequent etching steps have good selectivity and if the anti-fuse material is thick enough to minimize deleterious diffusion effects.

Figure 3:
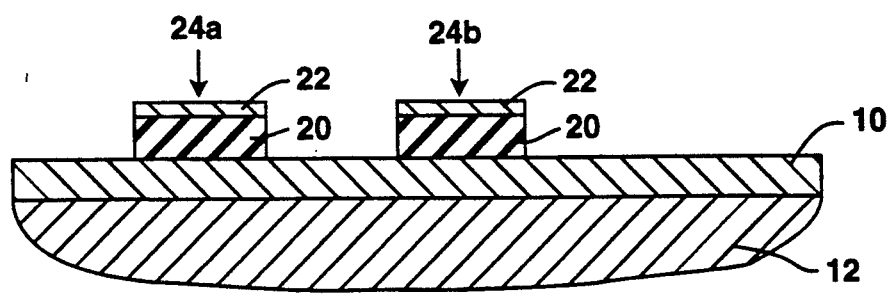

In FIG. 3, the anti-fuse layer 20 and the conductive protective layer 22 have been patterned to form two anti-fuse islands 24a and 24b. The patterning is accomplished by a photolithography process which, as is well known to those skilled in the art, typically involves the application of a resist to the protective layer 22, the exposure of the resist in a contact or stepper lithography system, the development of the resist to form a mask, and the sequential etching of the protective layer 22 and the anti-fuse layer 20 within a plasma etching system available from such companies as the aforementioned Applied Materials, Inc. As used herein, the terms "patterned" and "patterning" will refer to this process of forming a mask over a layer, etching the layer through the mask, and removing the mask.

Figure 4:
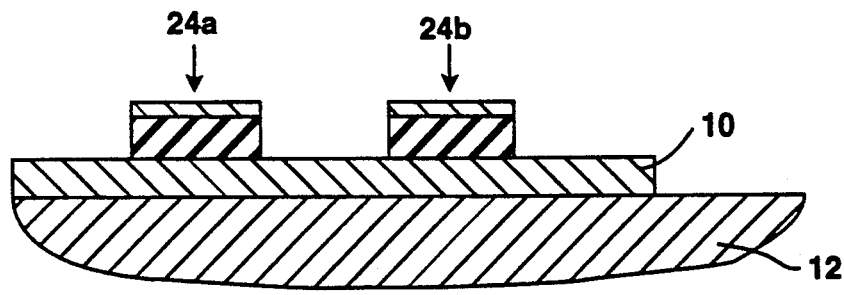

After the anti-fuse islands 24a and 24b are formed, the conductive base layer 10 is patterned as illustrated in FIG. 4. Typically, the base layer 10 is formed into a plurality of rows which interconnect a plurality of the anti-fuse islands. Alternatively, the above two patterning sequences can be interchanged, i.e. base layer 10 can be patterned first and then layer 20 and layer 22 can be patterned.

Figure 5:
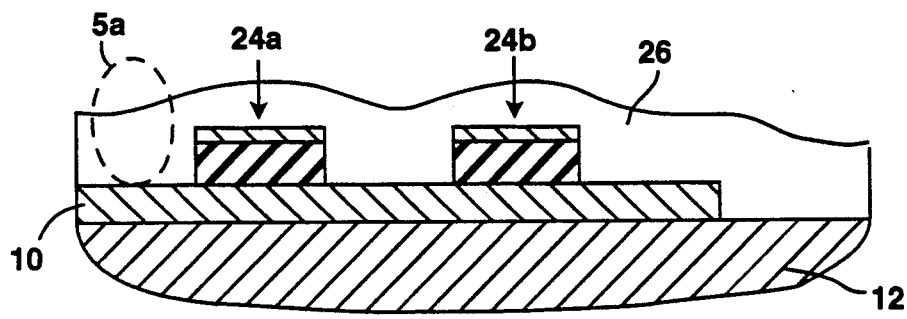
Figure 5A:
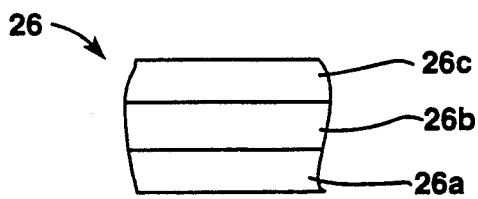

FIG. 5 shows an insulating layer 26 formed over the anti-fuse islands 24a and 24b, the base layer 10, and the substrate 12. As seen in FIG. 5a, this insulating layer 26 preferably comprises a sandwich comprising a layer 26a of silicon dioxide deposited to a depth of 3000 angstroms, followed by 2500 angstrom deep layer 26b of a spin-on glass (SOG) such as SILOXANE material for planarization, followed by a 6000 angstrom thick layer 26c of plasma enhanced chemical vapor deposition (PECVD) silicon dioxide. The silicon dioxide ($SiO_2$) layers can be deposited by a commercially available chemical vapor deposition system available from such companies as Novellus, Inc. of San Jose, Calif. and Applied Materials, Inc. The spin-on glass is available from such vendors as Allied Chemicals of Fremont, Calif. and can be deposited with a SOG machine made by Tozmo of Okayame, Japan and distributed by Semix of Fremont, Calif. The sandwich-like insulating layer 26 is often referred to as an "intermediate oxide layer" or IMO layer.

Figure 6:
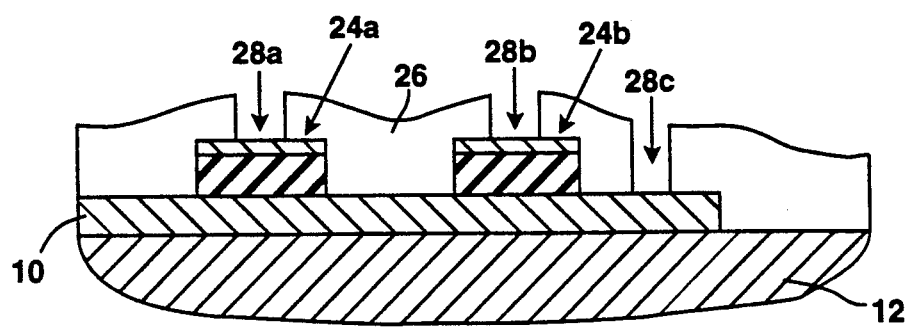

As seen in FIG. 6, the insulating layer 26 is then patterned to provide a plurality of via holes, such as via holes 28a, 28b, and 28c. The via holes 28a and 28b are aligned with the anti-fuse islands 24a and 24b, respectively, and the via hole 28c is aligned with a portion of conductive base layer 10. The via holes are provided to permit electrical contacts with the anti-fuse islands and the conductive base layer.

Figure 7:
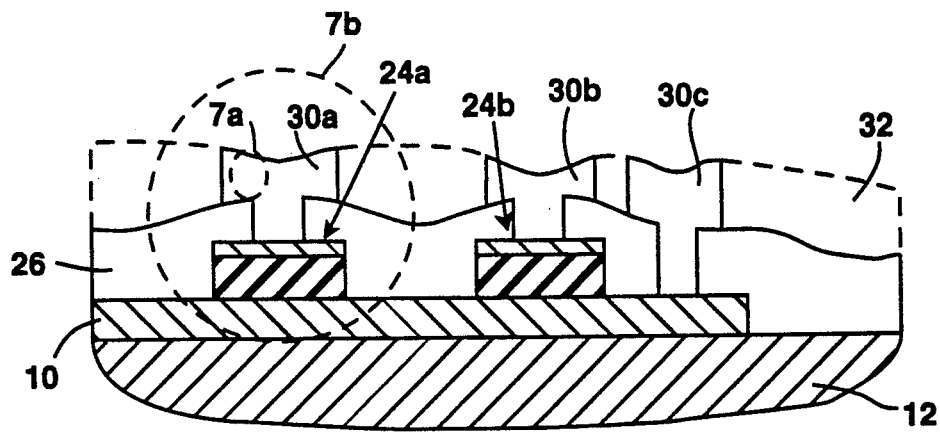
FIG. 7 illustrates an anti-fuse structure in accordance with the present invention.
Figure 7A:
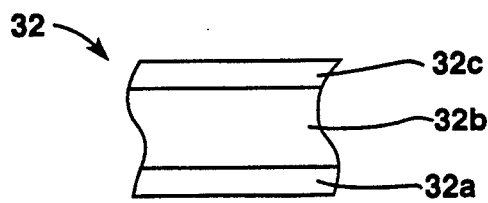

In FIG. 7, a number of conductive contacts 30a, 30b and 30c are formed by first forming a conductive connection layer 32 over the insulating layer 26 and then patterning the conductive connection layer 32 into the plurality of conductive contacts. As best seen in FIG. 7a, the construction of conductive connection layer 32 is preferably a three layer sandwich comprising a 2200 angstrom layer 32a of TiW, an 8500 angstrom layer 32b of AlCu, and an 800 angstrom layer 32c of TiW. The TiW and AlCu alloys are preferably of the same compositions as layers 14 and 16 described previously and can be deposited by the commercially available sputtering systems described previously. The contacts extend into the via holes, such as via holes 28a, 28b, and 28c to provide electrical contacts to the underlying structures. The contacts are also typically interconnects which couple a number of structures together or which serve to conduct electrical signals within the integrated circuit device. For example, a contact 30a often will couple a column of anti-fuse islands 24a together so that an individual anti-fuse island can be programmed or read by applying signals to a row of conductive base layer 10 by contact 30c and a column of conductive connection layer 32 by contact 30a.

Figure 7B:
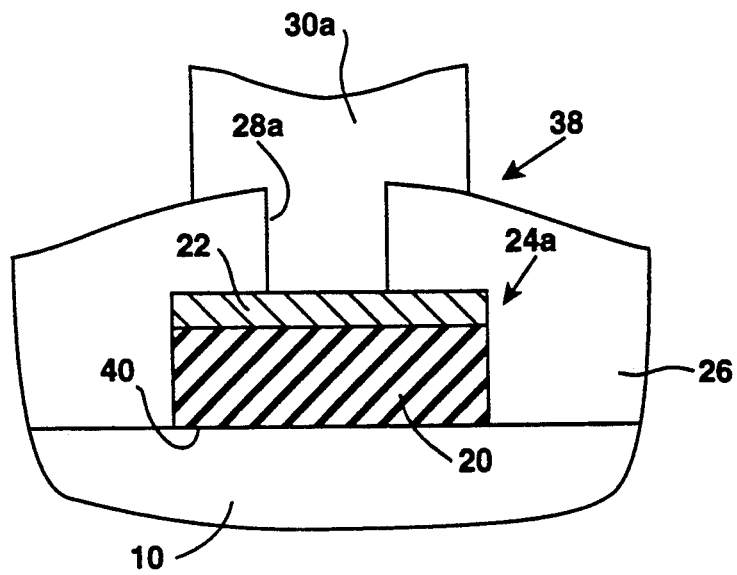
FIG. 7b is a detailed view of the portion of FIG. 7 encircled by broken line 7b.

FIG. 7b illustrates a single anti-fuse structure 38 as encircled by line 7b in FIG. 7. The anti-fuse structure 38 includes the conductive base 10, the anti-fuse island 24a, the insulating layer 26, and the conductive contact 30a. As described previously, the conductive base 10 is preferably a three-layer metal sandwich of TiW/AlCu/TiW and the anti-fuse island preferably includes an anti-fuse layer 20 of amorphous silicon and an optional conductive protective layer 22 of TiW. The insulating layer 26 is preferably a three layer insulating sandwich and the conductive contact is preferably a three layer conductive sandwich.

A typical anti-fuse structure 38 has an anti-fuse island 24a which is 1.4 microns wide, 1.4 microns long, and 0.16 microns thick. An unprogrammed anti-fuse structure 38 with these dimensions would have a resistance of approximately 1 giga-ohm. A programming voltage of approximately 10–12 volts d.c. applied between conductive base 10 and the conductive contact 30 will generate a current of typically 12–14 milli-amperes through the amorphous silicon of the anti-fuse layer, thereby causing a change in state of the amorphous silicon which results in a bi-directionally conductive path between the two metal layers. The resistance of the programmed anti-fuse decreases with increasing programming current, and resistances of well below 100 ohms can be easily achieved.

Figure 8:
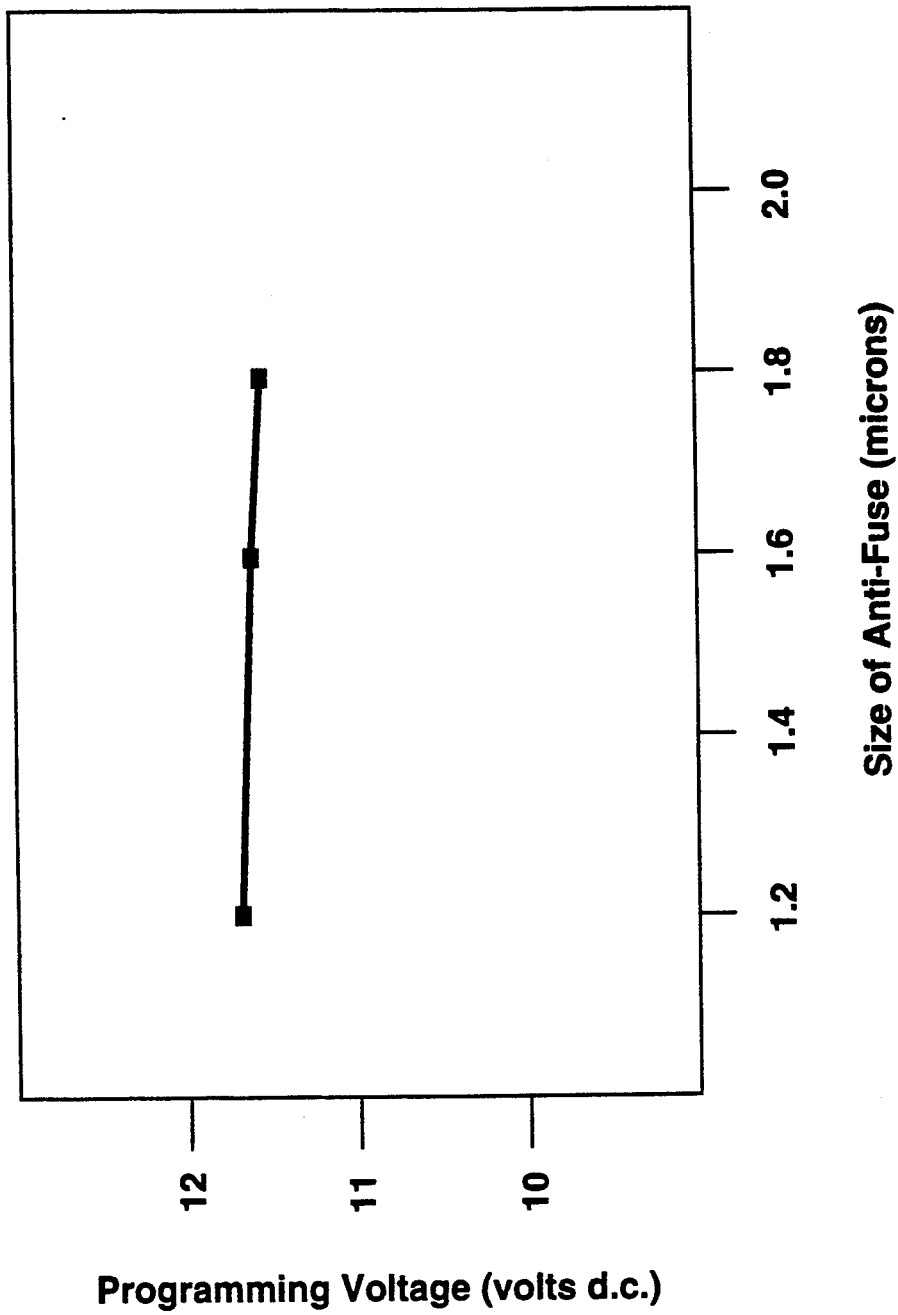
FIG. 8 is a graph illustrating the relative independence of programming voltage and anti-fuse size for the structure of the present invention.

As seen in FIG. 8, the size of an anti-fuse structure 38 has very little relationship to the programming voltage level of the structure. For example, anti-fuse structures having 1.2, 1.6. and 1.8 micron dimensions are all programmed at about 11.75 volts d.c. This is because the anti-fuse material is substantially cusp-free and defect-free, so that there are no weak points in the material which would allow lower voltages to accidently program the structure. Since the anti-fuse material is substantially uniform, the point at which which the programming current first flows through the material is essentially random. The aformentioned change in state of the anti-fuse material will start at this random point, and the amount of the material having a change in state will depend upon the level of the programming current. Usually, not all of the anti-fuse material undergoes the change in state and, in consequence, the resistance of a programmed anti-fuse structure is usually unrelated to the size of the structure. Since both the programing voltage level and the ultimate resistance of a programmed anti-fuse structure 38 (FIG. 7b ) is substantially unrelated to the size of the anti-fuse structure, the dimensions of the structure are scalable from many microns to the sub-micron range.

If the anti-fuse structures are used as interconnects for field programmable gate arrays, a programmed anti-fuse will result in a desired logical operation. If the anti-fuse structures are used as memory cells, they can be "read" by applying a read voltage of about 5 volts d.c. between the conductive base 10 and the conductive contact 30a. If almost no current flows through the contact 30a then that island has not been programmed, indicating a first logical state, and if current in a predetermined range flows through the anti-fuse island 24a, that island has been programmed, indicating a second logical state.

While this invention has been described in terms of several preferred embodiments, it is contemplated that various alterations and permutations thereof will become apparent to those skilled in the art. It is therefore intended that the appended claims include all such alterations and permutations as fall within the true spirit and scope of the present invention.

What is claimed is:

1. A method for making an anti-fuse structure, the method comprising the steps of:
   forming a conductive base layer having at least one substantially planar surface portion;
   forming an anti-fuse layer over at least said planar surface portion of said conductive base layer such that a lower surface portion of said anti-fuse layer that is in contact with said planar surface portion of said conductive base layer is also substantially planar;
   patterning said anti-fuse layer to form an anti-fuse island including said lower surface portion, such that said lower surface portion of said anti-fuse island contacts essentially only said substantially planar surface portion of said conductive base layer;
   forming an insulating layer over said anti-fuse island;
   forming a via hole through said insulating layer to said anti-fuse island;
   forming a conductive connection layer over said insulating layer and within said via hole;
   and
   patterning said conductive connection layer to form a conductive contact to said anti-fuse island through said via hole;
   whereby said anti-fuse island comprises a substantially cusp-free anti-fuse structure within said via hole.

2. A method for making an anti-fuse structure as recited in claim 1, further comprising the step of forming a conductive protective layer over said anti-fuse layer prior to patterning said anti-fuse layer, whereby said conductive protective layer forms a part of said anti-fuse island.

3. A method for making an anti-fuse structure as recited in claim 2, further comprising the step of patterning said conductive protective layer and said anti-fuse layer to form said anti-fuse island.

4. A method for making an anti-fuse structure as recited in claim 3, further comprising the step of including amorphous silicon in said anti-fuse layer.

5. A method for making an anti-fuse structure as recited in claim 4, further comprising the step of including an alloy including titanium and tungsten in said conductive protective layer.

6. A method for making an anti-fuse structure as recited in claim 5, further comprising the step of including aluminum in said conductive base layer.

7. A method for making an anti-fuse structure as recited in claim 6, further comprising the step of including in said conductive connection layer a composite layer comprising a layer including aluminum and a layer including tungsten and titanium.

8. A method for making an anti-fuse structure as recited in claim 1, further comprising the step of patterning said base layer after patterning said anti-fuse layer.

9. A method for making an anti-fuse structure as recited in claim 1, wherein a plurality of anti-fuse islands, via holes, and conductive contacts are formed to provide a plurality of anti-fuse islands.

10. A method for making an anti-fuse structure as recited in claim 1, further comprising the step of providing as said conductive base layer a multilayer structure that comprises a first sub-layer that suppresses migration of atoms of a selected element across the first sub-layer, a second sub-layer that provides a low resistance path across the second sub-layer, and a third sub-layer that suppresses migration of atoms of a selected element across the third sub-layer, where the third sub-layer is positioned contiguous to said anti-fuse layer and said second sub-layer is positioned between and contiguous to the first and third sub-layers.

11. A method for making an anti-fuse structure as recited in claim 10, further comprising the steps of:
including an alloy comprising titanium and tungsten in said first sub-layer;
including an alloy comprising aluminum and copper in said second sub-layer; and
including an alloy comprising titanium and tungsten in said third sub-layer.

* * * * *